United States Patent [19]
Blaker et al.

[11] Patent Number: 5,537,445
[45] Date of Patent: Jul. 16, 1996

[54] VARIABLE LENGTH TRACEBACKS

[75] Inventors: David M. Blaker, Emmaus, Pa.; Gregory S. Ellard, Forest Park, England; Mohammad S. Mobin, Whitehall, Pa.

[73] Assignee: AT&T Corp., Murray Hill, N.J.

[21] Appl. No.: 462,459

[22] Filed: Jun. 5, 1995

Related U.S. Application Data

[63] Continuation of Ser. No. 152,531, Nov. 16, 1993, abandoned.

[51] Int. Cl.⁶ .................................................. H04L 27/06
[52] U.S. Cl. ............................................ 375/341; 371/43
[58] Field of Search ..................................... 375/262, 341, 375/43, 44

[56] References Cited

U.S. PATENT DOCUMENTS

| | | | |
|---|---|---|---|
| 3,789,360 | 1/1974 | Clark, Jr. et al. | 371/43 |
| 4,493,082 | 1/1985 | Cumberton et al. | 371/43 |
| 4,583,078 | 4/1986 | Shenoy et al. | 371/43 |
| 4,748,626 | 5/1988 | Wong | 371/30 |
| 4,797,887 | 1/1989 | Yamasaki et al. | 371/43 |
| 4,868,830 | 9/1989 | Pollara-Bozzola | 371/43 |
| 4,905,317 | 2/1990 | Suzuki et al. | 371/43 |
| 5,432,804 | 7/1995 | Diamondstein et al. | 371/43 |

FOREIGN PATENT DOCUMENTS 0127984   5/1984   European Pat. Off. .

Primary Examiner—Tesfaldet Bocure
Attorney, Agent, or Firm—David L. Smith

[57] ABSTRACT

A digital communication system including Viterbi decoder for tracing a path through a trellis of individual state information and method of operation are disclosed. The traceback determines a decoded symbol. The trellis of surviving branch data is stored in an array of registers. Operating the system includes initiating a first traceback from a storage register at a first symbol instant. The traceback traces a path back through the trellis a first predetermined number of symbol instants to determine a first decoded symbol. A second traceback is also initiated at the first symbol instant and traces a path back through the trellis a second predetermined number symbol instants to determine a second decoded symbol. The first traceback length may be greater than or less than the second traceback length. In another embodiment of the invention several tracebacks can be executed having a fixed traceback length, followed by other tracebacks having incrementally different traceback lengths. Such multiple tracebacks may be initiated in a single symbol instant. In yet another embodiment of the invention, selective ones of the decoded symbols are used by an equalizer to provide channel adaptation.

9 Claims, 10 Drawing Sheets

VARIABLE LENGTH TRACEBACKS

This application is a continuation of application Ser. No. 08/152,531, filed on Nov. 16, 1993, abandoned.

CROSS-REFERENCE TO RELATED APPLICATIONS

This application is related to the following concurrently filed, co-pending applications, each of which is incorporated herein by herein by reference:

Application Ser. No. 08/153,334, entitled "Efficient Utilization of Present State/Next State Registers", filed Nov. 16, 1993, by D. Blaker, M. Diamondstein, G. Ellard, M. Mobin, H. Sam and M. Thierbach, our docket number Blaker 3-2-3-3-4-10;

Application Ser. No. 08/153,334, entitled "Power and Time Saving Initial Tracebacks", filed Nov. 16, 1993, by D. Blaker, G. Ellard, and M. Mobin, our docket number Blaker 6-6-6;

Application Ser. No. 08/152,805, entitled "Digital Receiver with Minimum Cost Index Register", filed Nov. 16, 1993, by D. Blaker, G. Ellard, M. Mobin and H. Sam, our docket number Blaker 2-2-2-3;

Application Ser. No. 08/153,405, entitled "Digital Processor and Viterbi Decoder Having Shared Memory", filed Nov. 16, 1993, by M. Diamondstein, H. Sam and M. Thierbach, our docket number Diamondstein 1-2-8;

Application Ser. No. 08/152,807, entitled "Digital Signal Processor", filed Nov.16, 1993, by D. Blaker, G. Ellard, M. Mobin, and M. Thierbach, our docket number Blaker 5-5-5-9; and Application Ser. No. 08/153,391, entitled "Digital Signal Processor", filed Nov. 16, 1993, by D. Blaker, G. Ellard and M. Mobin, our docket number Blaker 1-1-1.

TECHNICAL FIELD

This invention relates generally to radio transmission such as digital cellular telephony and particularly to estimating distortion in a received signal so that the distortion can be reduced.

BACKGROUND OF THE INVENTION

Radio waves propagate at the speed of light. In cellular radio transmissions, a transmitted signal can arrive at a receiver at multiple times due to refraction, diffraction or reflection. Refraction occurs when the path of propagation of the transmitted signal bends to follow the curvature of the earth. Diffraction occurs when the path of propagation passes around obstacles. Reflection occurs when a transmitted signal bounces off of either the atmosphere, or obstacles in the path of propagation such as terrain, water tanks or buildings. Each of these phenomena can contribute to a multiplicity of signals being received at the receiver. Each of these signals was initially the originally transmitted signal. Each of the received signals is distorted by the particular path it transverses. Each signal is received at slightly different times due to the differences in the length of the path of propagation. Relative motion between a transmitter and receiver further contribute to variations in the received signal. When the transmitted signal is digital symbols, intersymbol interference occurs and may extend over several symbol time periods. The receiver must reliably extract the transmitted signal from these various received signals.

Time division multiple access encoded information is transmitted in multiple channels per carrier. In accordance with the Group Special Mobile (GSM) standard, there are eight channels per carrier. Each channel is provided a time period for transmission called a transmission burst. Some of the bits in each transmission burst are set aside as a training bits for system use. The bits of the training segment, or a portion of them, have been used as a means to adapt the decoding process to compensate for channel characteristics. However, these bits are received only once during each transmission burst whereas the channel characteristics can change over the entire time during which the transmission burst is transmitted. When the channel characteristics change during the entire transmission burst, the channel estimates obtained using training bits are not representative of the channel characteristics of the entire frame, particularly at the two extreme ends of the transmission burst.

A Viterbi decoder is a maximum likelihood decoder that provides forward error correction. Viterbi decoders are used to decode a sequence of encoded symbols, such as a bit stream. The bit stream can represent encoded information in telecommunication system. Such information can be transmitted through various media with each bit (or set of bits) representing a symbol instant. In the decoding process, the Viterbi decoder works back through a sequence of possible bit sequences at each symbol instant to determine which one bit sequence is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can transition only to a limited number of next states upon receipt of the next bit in the bit stream. Thus, some paths survive and other paths do not survive during the decoding process. By eliminating those transitions that are not permissible, computational efficiency can be increased in determining the most likely paths to survive. The Viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transition, the accumulated cost for the next state is calculated as the lesser of the sum of the branch metric for the possible transitions and the path accumulated cost at the previous state.

While several paths survive the transition from one symbol instant to the next symbol instant, there is only one minimum accumulated cost path from the least of the minimum accumulated costs at a symbol instant, back through the possible branches. The representation of surviving branch data at sequential symbol instants in an array is referred to as a trellis. Identifying the minimum accumulated cost path starting with a given symbol instant is referred to as a traceback. The number of symbol instants back through the trellis that the minimum accumulated cost path extends is the length, or depth, of the traceback. The individual state in the trellis associated with the minimum accumulated cost at the end of the traceback is translated into the most likely bit to have been transmitted in that symbol instant. This bit is referred to as a decoded symbol. The longer the traceback length, the greater the accuracy in determining a decoded symbol.

Viterbi decoders have typically used a fixed length traceback to decode encoded symbols. A need remains in the an for a technique to vary the length of a traceback operation in a Viterbi decoder to provide a more effective channel adaptation technique. Such a technique would provide information derived from a shorter traceback operation to adapt a channel model. Such a technique could be frequently and repeatedly executed to track channel variations and compensate for rapidly changing channel characteristics.

SUMMARY OF THE INVENTION

In accordance with one aspect of the invention, a method of operating a digital communication system for tracing a path through a trellis of individual state information is disclosed. The traceback determines a decoded symbol. A trellis of individual state information is stored in an array of registers. The method includes initiating a first traceback from a storage register at a first symbol instant. The traceback traces a path back through the trellis a first predetermined number of symbol instants to determine a first decoded symbol. A second traceback is also initiated at the first symbol instant and traces a path back through the trellis a second predetermined number symbol instants to determine a second decoded symbol. The first traceback length may be greater than, equal to, or less than the second traceback length.

In another embodiment of the invention several tracebacks are executed having a fixed traceback length, followed by other tracebacks having incrementally different traceback lengths. The tracebacks having incrementally different traceback lengths may be initiated from a single symbol instant.

In yet another embodiment of the invention, selective ones of the decoded symbols are used by an equalizer to provide channel adaptation.

DETAILED DESCRIPTION

Figure 1:
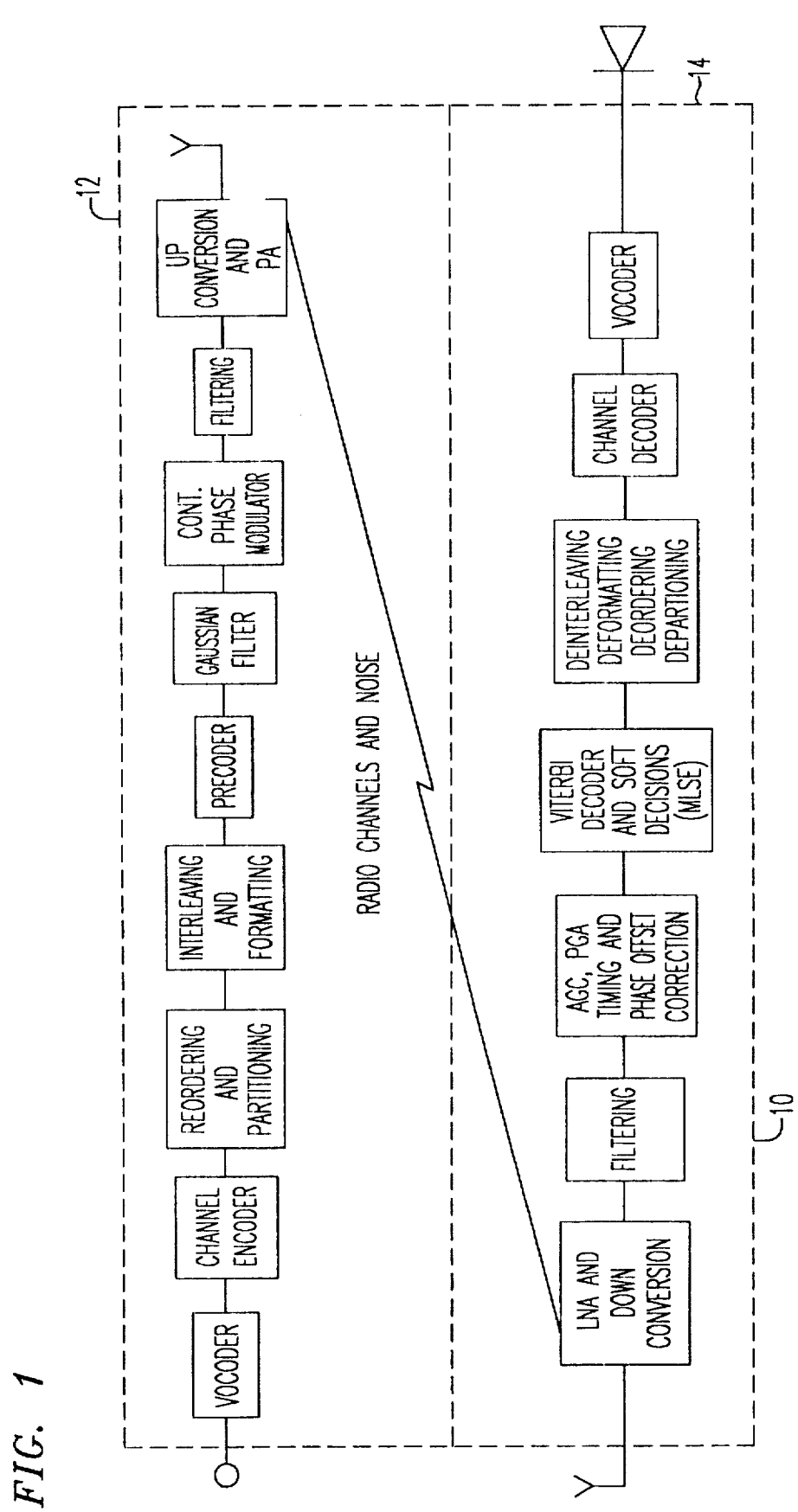
FIG. 1 is a block diagram of a transceiver, in accordance with an illustrative embodiment of the present invention.

Transceiver 10 shown in the block diagram of FIG. 1, is an illustrative embodiment of the invention. Transceiver 10 is a communication system or portion of a communication system such as a mobile digital cellular telephone. Transceiver 10 is comprised of a transmitter 12 and receiver 14.

Figure 2:
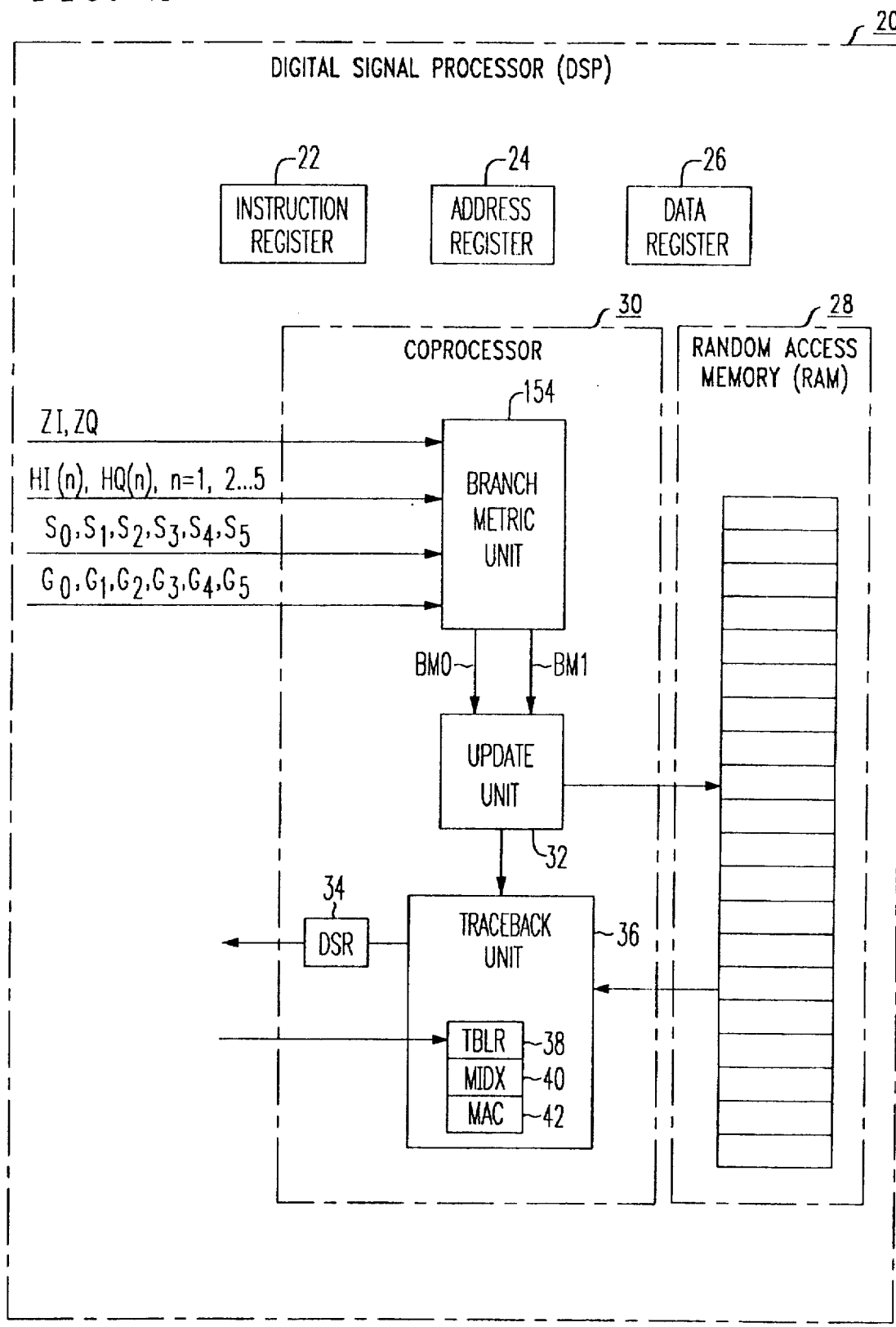
FIG. 2 is a partial block diagram of a transceiver showing digital signal processor having an error correction coprocessor.

FIG. 2 is a partial block diagram of a transceiver 10, shown in more detail. Transceiver 10 includes a digital signal processor (DSP) 20 having an error correction coprocessor 30. Error correction coprocessor 30 may be embedded in DSP 20. Some of the registers of random access memory (RAM) of DSP 20 are allocated as a traceback RAM 28. Alternatively, dedicated RAM could be provided. Traceback RAM 28 may be accessible to both DSP 20 and coprocessor 30.

An indirect addressing technique is used to write data to and read data from the coprocessor 30. To write data to a register at an address in coprocessor 30, an address is written to address register 24 and the data is written to data register 26. The address is transferred from DSP 20 to an address generator in coprocessor 30 and is translated into the address of a corresponding register. To read data from a register at an address in coprocessor 30, an address is written into address register 24 of DSP 20. The address is transferred to the coprocessor and translated to the address of a corresponding register in the coprocessor. The data at the addressed coprocessor register is read by reading data register 26 of DSP 20. Instructions are passed to the coprocessor by writing an instruction into the instruction register 22.

In the above manner, the complex received signals ZI and ZQ, complex tap weights HI(n) and HQ(n), n=1, 2, ... 5, soft symbols $S_0$ through $S_5$ and generating polynomials $G_0$ through $G_5$ are provided as inputs of the branch metric unit 154 within coprocessor 30. The branch metric unit provides two branch metric values, BM0 and BM1, per individual state to update unit 32. The branch metric values are utilized as is known in the art to update the accumulated cost.

Update unit 32 provides to traceback unit 36 the minimum accumulated cost which is stored in the minimum accumulated cost (MAC) register 42. Update unit 32 also provides the address of the register in traceback RAM 28 in which the minimum accumulated cost has occurred, and stores that address in MIDX register 40.

Traceback unit 36 provides individual state information defining the minimum accumulated cost path through the trellis, as well as soft decision confidence level in decoded symbols to traceback RAM 28. At the end of a traceback, update unit 32 also provides a decoded symbol to DSP 20 by way of decoded symbol register (DSR) 34.

Traceback length register (TBLR) 38 is the register in which the traceback length is stored. The traceback length can be changed by over-writing the existing traceback length stored in TBLR 38. In this manner, the traceback length is programmable. A traceback, initiated by a traceback instruction to coprocessor 30 from DSP 20, can be executed and the traceback length can be different than previous or subsequent tracebacks. An update instruction from the DSP causes another cell of traceback RAM to be filled as the trellis is being constructed. Tracebacks can be executed between two update instructions or even after an update instruction when there are no more symbols to update, such as when the trellis is complete. Such tracebacks can be of different lengths and multiple tracebacks may be executed at a single symbol instant.

Figure 3:
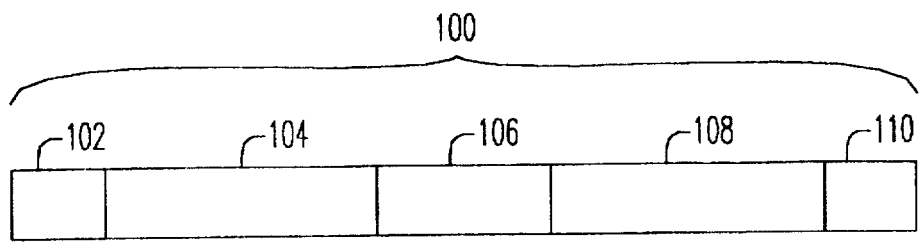
FIG. 3 is an illustration showing the structure of bits in an exemplary transmission burst.

An exemplary frame, or transmission burst, 100 of information transmitted, typically by a base station or mobile digital cellular telephone to the other, is shown in FIG. 3. The transmission burst contains a predetermined number of bits. Each frame includes starting bits 102, a first set of information bits 104, training bits 106, a second set of information bits 108 and ending bits 110. Typically there are three starting and ending bits, 58 bits in each set of information bits, and 26 training bits, for a total of 148 bits per frame. The training bits are also known. The starting and ending bits are known and typically are zeros.

The training bits are used to calculate an initial estimate of the channel between the transmitting base station and the receiving mobile digital cellular telephone. A perfect digital signal is transmitted. However, the received signal is distorted due to noise and interference. As the mobile digital cellular telephone moves through its environment, the characteristics of the channel over which the signals are transmitted and received change. To improve the accuracy of the decoded symbols, it is desirable to track the channel variations. Each frame contains training bits from which channel model parameters can be initially calculated.

In calculating channel model parameters, a finite number of time delayed received signals can be used to remove the effects of channel distortion from the received signal. A filter is employed having a finite number of tap weights (also known as taps or channel taps) corresponding to the finite number of delayed signals used to remove effects of distortion. The number of taps may be varied, such as from 2 to 6.

Figure 4:
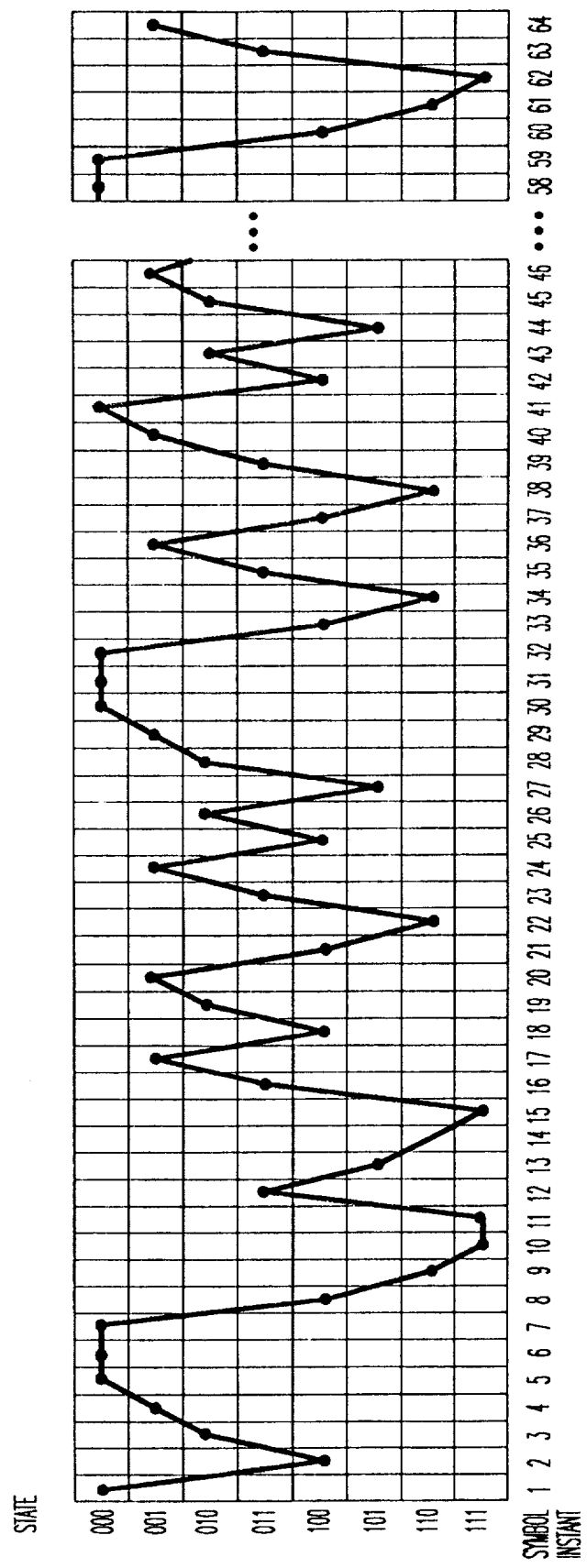
FIG. 4 is a matrix representing a trellis diagram useful in describing the present invention.

Before describing how the channel taps are used and adapted, an understanding of the traceback operation in a Viterbi decoder is necessary. FIG. 4 shows a trellis diagram in traceback RAM 28. At each state or symbol instant (shown horizontally), there are a number of states (shown vertically) that range from zero up to $2^{C-1}-1$ where C is the constraint length. These $2^{C-1}$ states are referred to as individual states. The trellis diagram shown in FIG. 4 is constructed one symbol instant at a time, as is known in the art. The trellis entries at each symbol instant comprise a cell. A single update instruction from DSP 20 to coprocessor 30 initiates an update operation by update unit 32 to produce a cell of trellis entries. At each symbol instant, each individual state of the illustrative embodiment shown in FIG. 4 can only transition to two possible individual states at the next symbol instant. Concomitantly, each individual state at the next symbol instant has only two possible previous individual states from which a transition to it can originate. Other decoders could have more than two transitions to a next state.

A branch metric is calculated at each symbol instant for each possible transition from an individual state at one symbol instant to an individual state at the next symbol instant. Various methods for calculating branch metrics are known in the art. The branch metric of both branches transitioning to a given next individual state are calculated, then added to the accumulated cost of the respective originating individual state. This results in two potential accumulated cost sums. A comparison is made of the two potential accumulated cost sums. An extremum branch metric, such as the lesser of the two sums, is selected as the next state accumulated cost. A transition corresponding to the lesser sum is the more likely transition from the two possible originating individual states to the given next individual state. The originating individual state of the more likely transition is stored in traceback RAM 28 (forming the trellis of FIG. 4) as the surviving branch to the given next individual state as is known in the art. The lesser sum is the accumulated cost of the next individual state. This process is repeated for each of the next individual states and repeated also for each symbol instant until all of the symbols in the bit stream are decoded.

Traceback RAM 28 can be addressed using modulo addressing. This results in a finite length array appearing to be circular. Consider a traceback of length 60 initiated from symbol instant 30 in an array having 64 symbol instants designated 1 through 64. When the traceback is completed, the traceback terminates in symbol instant 34. The traceback starts in symbol instant 30, traces back through symbol instants 29, 28, 27 down through symbol instant 1, symbol instant 64, 63, 62 and so forth until reaching symbol instant 34. At symbol instant 34, the individual state associated with the minimum accumulated cost is translated into a decoded symbol.

The decoded symbol at each symbol instant can be obtained by waiting until the trellis is complete. Then, starting with the individual state in the last symbol instant having the minimum associated accumulated cost, trace back through the trellis once. At each symbol instant of this traceback, the originating individual state is translated into a decoded symbol for that symbol instant as is known in the art.

Alternatively at each symbol instant during the construction of the trellis, a predetermined length traceback operation can be initiated to obtain a decoded symbol at a previous symbol instant. The previous symbol instant will precede the symbol instant at which the traceback is initiated, the present symbol instant, by the traceback length. As the traceback RAM is filled with branch origin data, DSP 20 alternates instructions between update and traceback. Each update constructs one more cell in the trellis. Each traceback decodes a symbol. After all updates are complete, the update instruction is omitted and subsequent tracebacks decode the remaining symbols. Each occurrence a symbol instant increases, another traceback operation will provide another decoded symbol. In this manner, for a constant length traceback, a series of decoded symbols at sequential symbol instants are decoded.

In accordance with the present invention, as the trellis is being constructed in traceback RAM 28, a traceback of a first length is followed by a traceback of a second, shorter length. The traceback length may alternate between a longer traceback length and a shorter traceback length. Alternatively, a series of tracebacks having a longer traceback length are followed by one or more tracebacks having a shorter traceback length as the trellis is being constructed. Multiple tracebacks may occur at a symbol instant.

Figure 6:
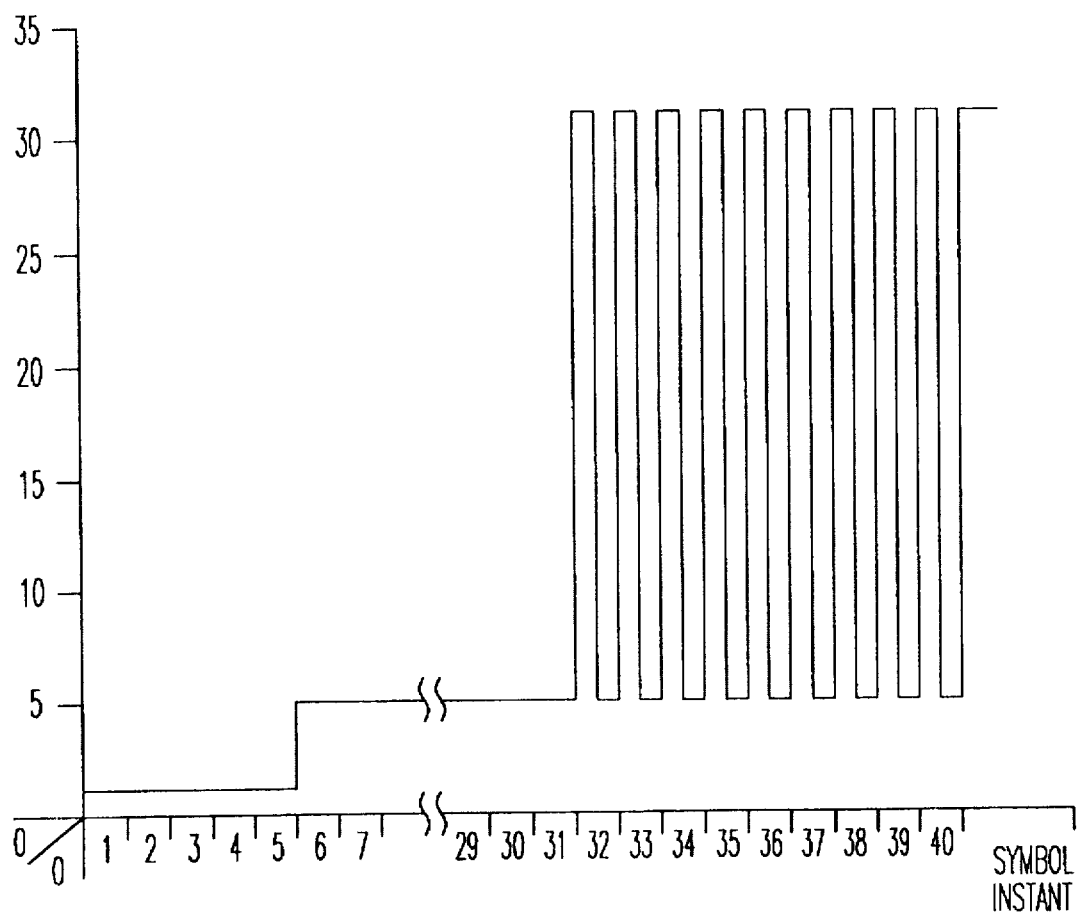
FIG. 6 is a graphical representation of the various traceback lengths of FIG. 5, shown by symbol instant.
Figure 5:
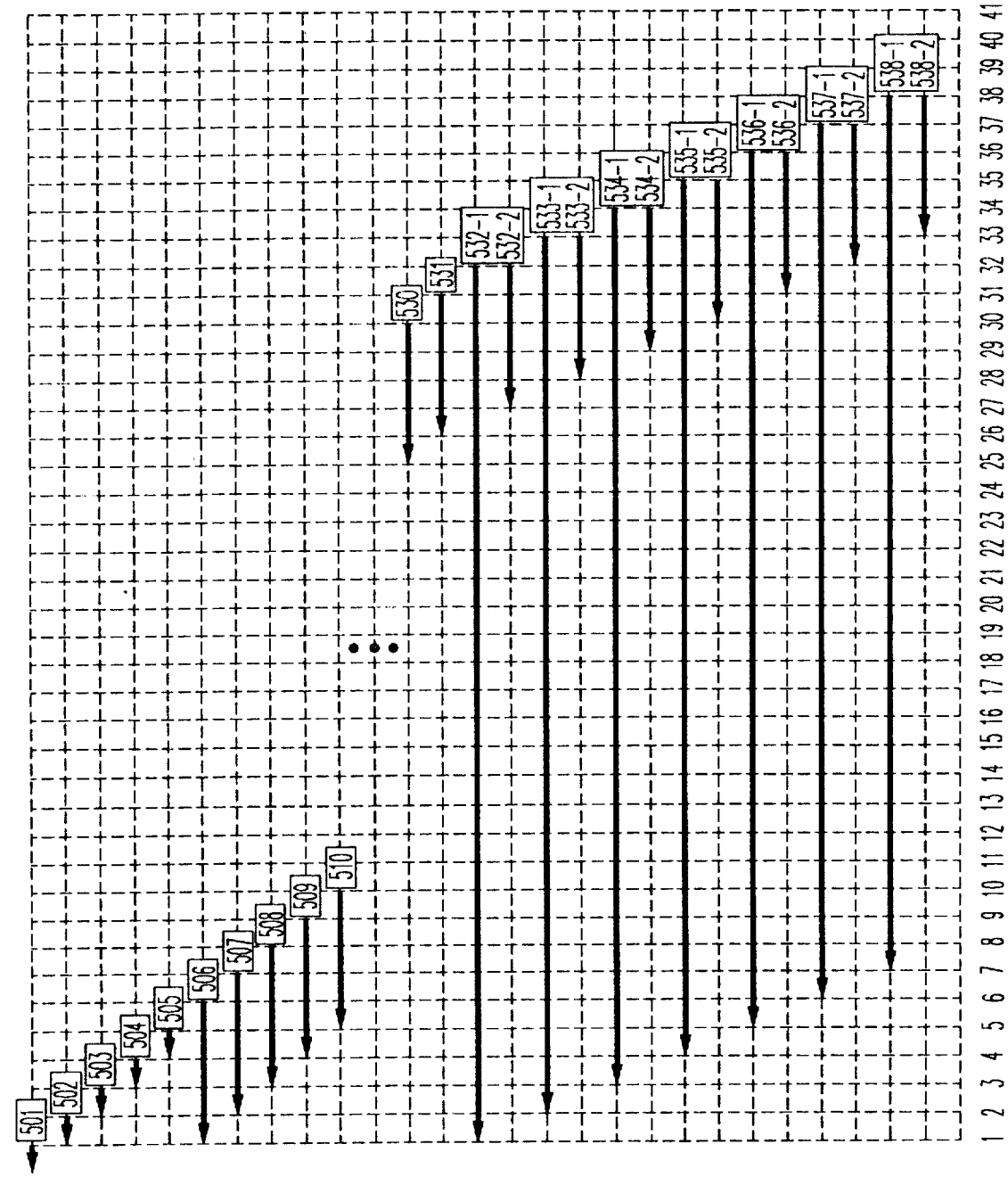
FIG. 5 is an illustration of tracebacks of various lengths, initiated at various of the symbol instants.

An example is shown in FIG. 5 in which an arrow is used to illustrate a traceback. The tail of the arrow is positioned above the symbol instant in which the traceback is initiated. The length of the arrow represents the length of the traceback. The head of the arrow is positioned above the previous symbol instant where a symbol is decoded. The traceback length for each symbol instant is shown in FIG. 6.

The first traceback length is written to traceback length register 38. As the trellis is formed, a traceback 501 having a first traceback length is executed. A single instruction from DSP 20 to coprocessor 30 initiates a traceback by traceback unit 36. The first traceback length is very short, for example 1. The traceback may cycle into portions of the trellis having surviving branch data from a previous transmission burst. The decoded symbol at the end of this traceback is typically discarded.

Subsequent tracebacks 502, 503, 504 and 505 may be executed having a first traceback length by repeated instructions to the traceback unit. The decoded symbol at the end of each such traceback is typically discarded. Executing a traceback having a very short traceback length where the decoded symbol is discarded minimizes the resources of time and energy expended in generating a symbol that is not used.

At a first predetermined symbol instant during construction of the trellis, the traceback length is changed to a second traceback length. This is achieved by over-writing traceback length register 38 with the second traceback length. Typically, the second traceback length is greater than the first traceback length. A traceback having a second traceback length is initiated from the first predetermined symbol instant such that the traceback does not cycle into portions of the trellis having surviving branch data from a previous burst. For example, in symbol instant 6, a traceback 506 of length 5 can be initiated resulting in a decoded symbol in symbol instant 1. The decoded symbol resulting from a traceback having a second traceback length will be referred to as an ephemeral decoded symbol. Ephemeral decoded symbols are binary. How ephemeral decoded symbols are used will be described below.

Subsequent tracebacks such as 507 through 531 may be executed having a second traceback length. These tracebacks result in ephemeral decoded symbols in symbol instants 2 through 26. At a second predetermined symbol instant the traceback length is changed to a third traceback length. Typically, the third traceback length is substantially greater than the second traceback length. Longer traceback lengths provide greater accuracy in determining a decoded symbol. A traceback having a third traceback length is initiated from the second predetermined symbol instant.

Typically, the magnitude of the third traceback length is less than the magnitude of the second predetermined symbol instant such that the traceback does not cycle into portions of the trellis having associated accumulated costs from a previous transmission burst. For example, in symbol instant 32 a traceback 532-1 of length 31 can be initiated. This traceback having a third traceback length results in a final decoded symbol for symbol instant 1. Final decoded symbols are also binary.

In the same symbol instant, 32, the traceback length can be changed to the second traceback length and a traceback 532-2 initiated. This traceback results in an ephemeral decoded symbol in symbol instant 27.

In the next symbol instant, 33, the traceback length is changed back to the third traceback length. A traceback, 533-1, having a third traceback length is executed, resulting in a final decoded symbol in symbol instant 2. In the same symbol instant, the traceback length is changed back to the second traceback length. A traceback, 533-2, is executed resulting in an ephemeral decoded symbol in symbol instant 28. The traceback length at each symbol instant for this example is graphed in FIG. 6.

It is noted that beginning with the second predetermined symbol instant, two tracebacks per symbol instant have been described. At each symbol instant, a longer length traceback is followed by a shorter length traceback. The order of longer and shorter traceback is not relevant. The number of times the traceback length is changed could be reduced by alternating the sequence of longer and shorter traceback lengths in adjacent symbol instants, as shown in FIGS. 7 and 8.

Figure 8:
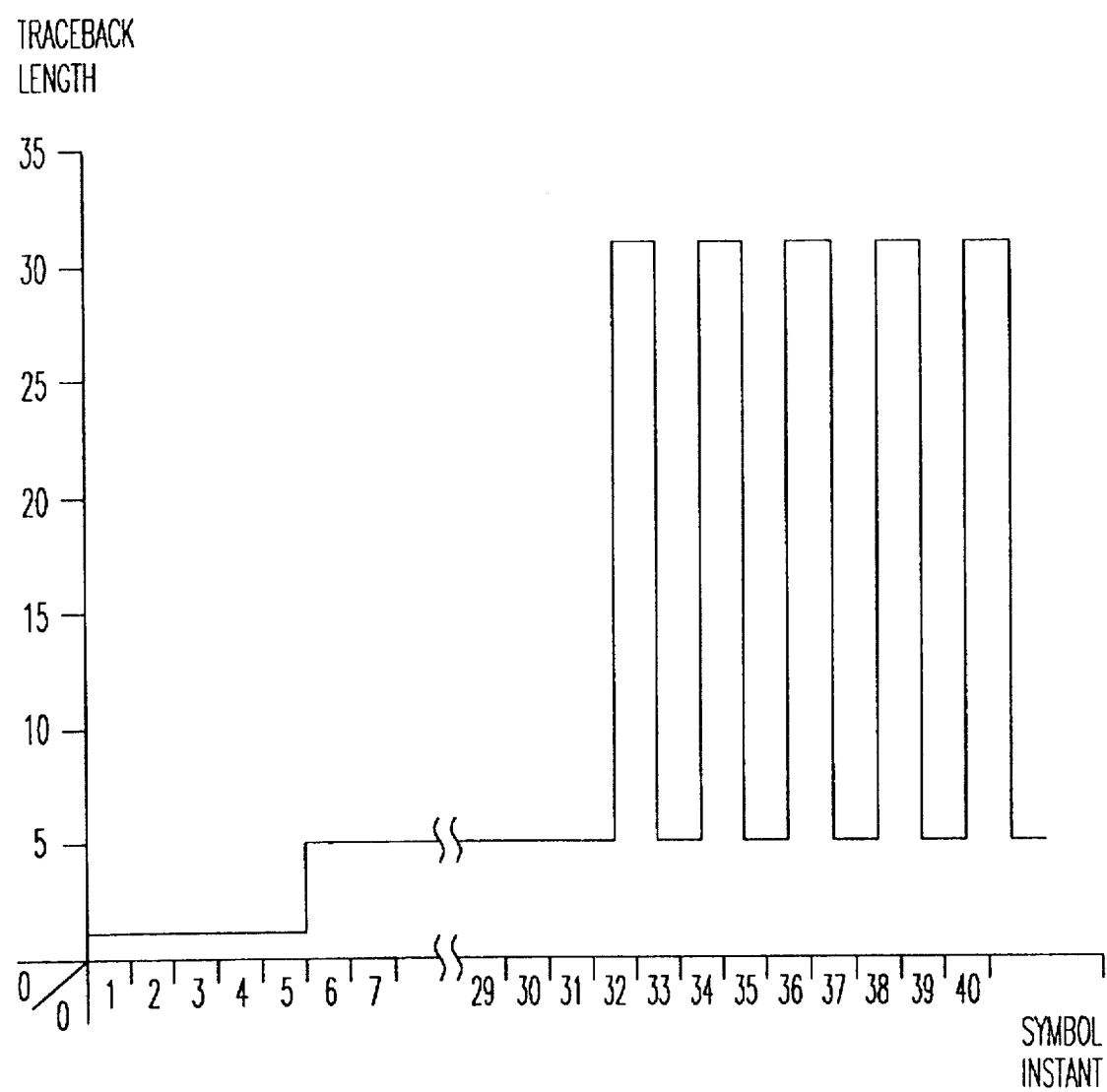
FIG. 8 is a graphical representation of the various traceback lengths of FIG. 7.

The traceback length at each symbol instant for this example is shown as FIG. 8. For symbol instants above 30, the frequency of changing the traceback length is reduced compared to FIG. 6.

In this manner, two tracebacks are initiated from each symbol instant starting with the second predetermined symbol instant. The tracebacks having the second traceback length result in a series of ephemeral decoded symbols, one at each symbol instant. The tracebacks having the third traceback length result in a series of final decoded symbols, one at each symbol instant.

Figure 7:
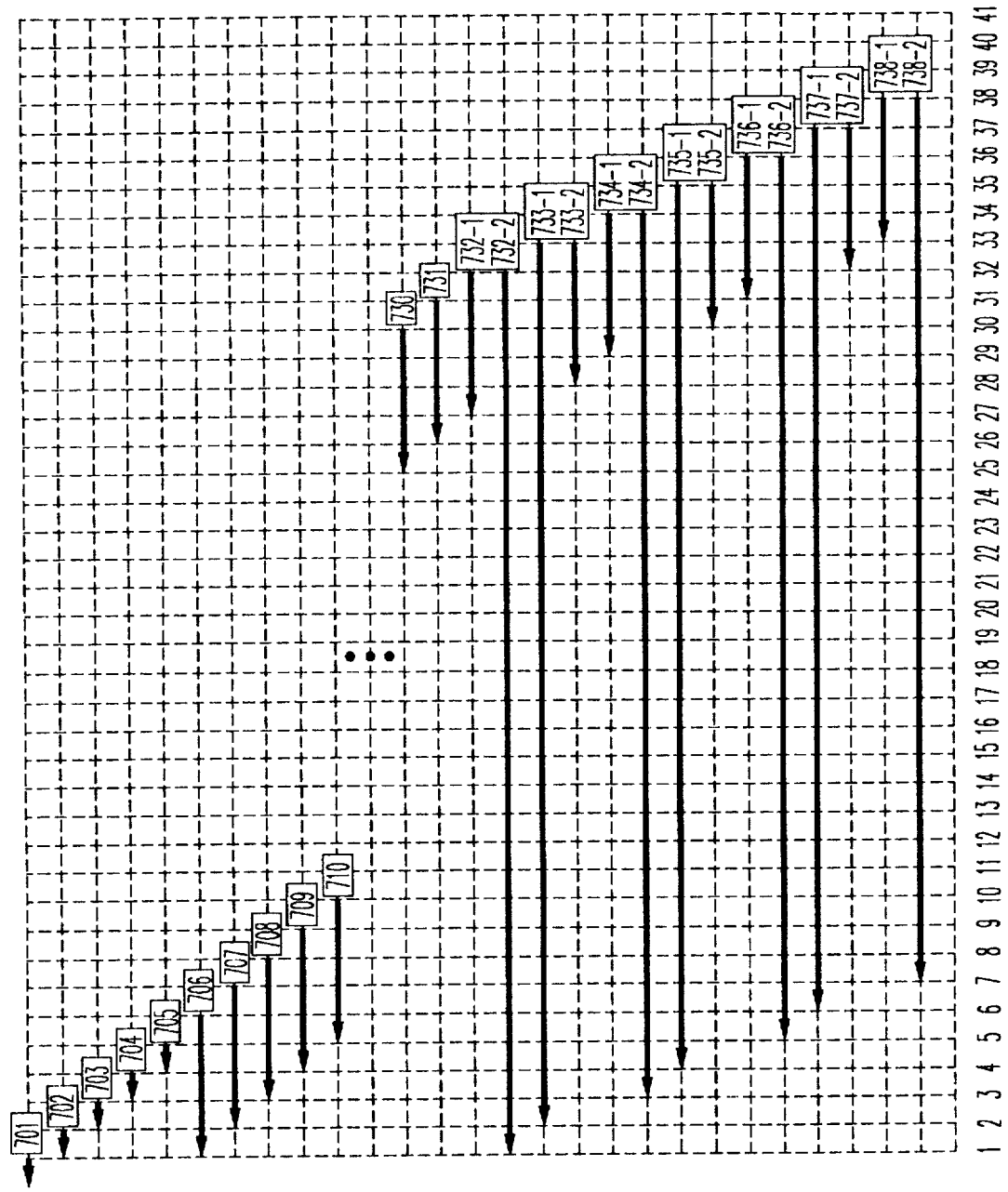
FIG. 7 is an illustration of tracebacks of various lengths similar to FIG. 5, exhibiting a different sequence.

As shown in FIG. 7, the series of tracebacks 701 through 731 for symbol instants 1 through 31 may be the same as or different from those shown in FIGS. 5 and 6. In symbol instant 32, a traceback 732-1 having the second traceback length is executed resulting in an ephemeral deemed symbol in symbol instant 27. The traceback length is changed to the third traceback length and a traceback 732-2 is executed, resulting in a final decoded symbol instant 1.

In the next symbol instant, 33, a traceback 733-1 having the third traceback length is executed, resulting in a final decoded symbol in symbol instant 2. In the same symbol instant, the traceback length is changed back to the second traceback length. A traceback 733-2 is executed resulting in an ephemeral decoded symbol in symbol instant 28.

In symbol instant 34, the first traceback 734-1 is executed having a second traceback length resulting in an ephemeral decoded symbol in symbol instant 29. The traceback length is changed to the third traceback length and traceback 734-2 executed resulting in a final decoded symbol in symbol instant 3.

Figure 9:
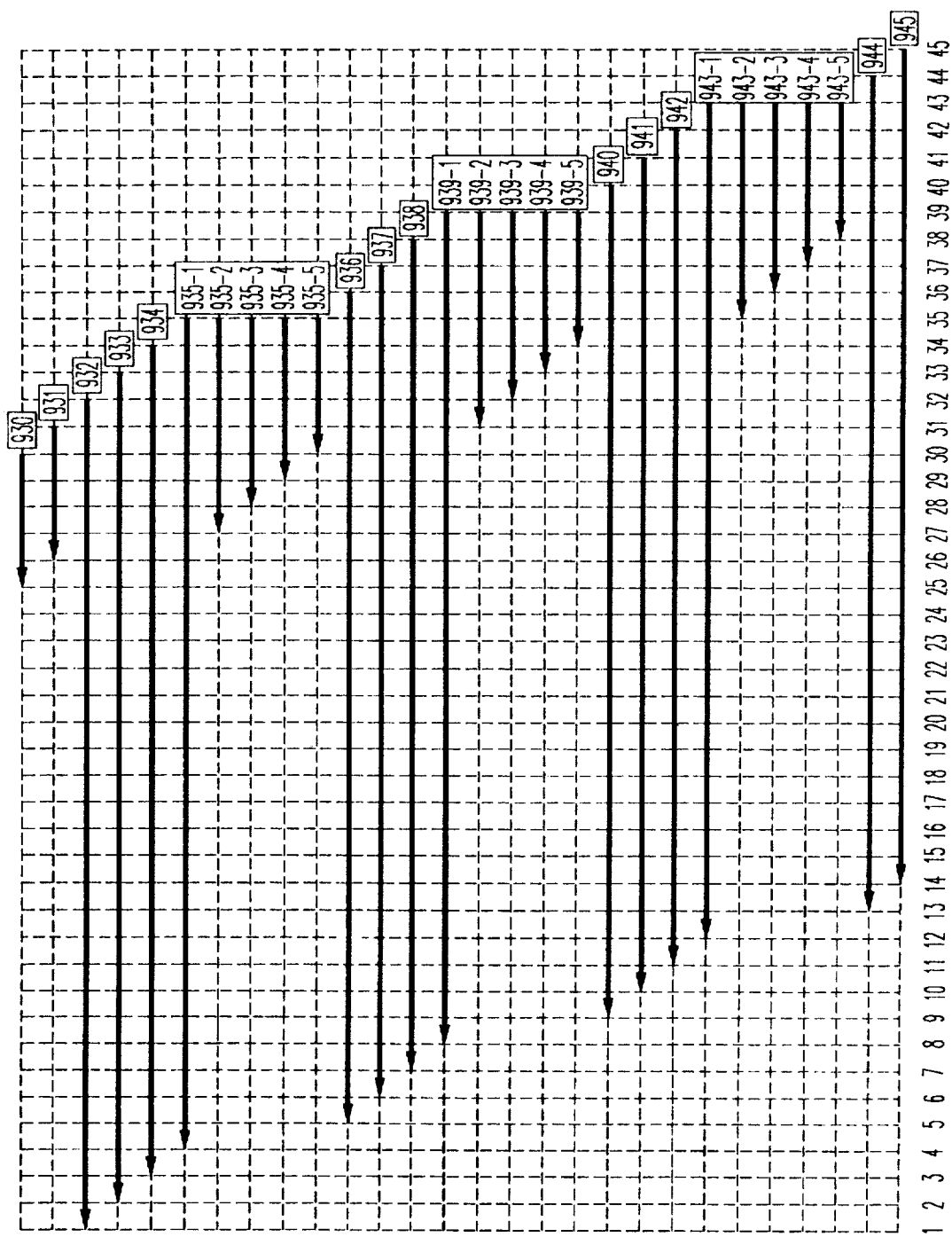
FIG. 9 is an illustration of tracebacks of various lengths similar to FIG. 5, exhibiting a different sequence.
Figure 10:
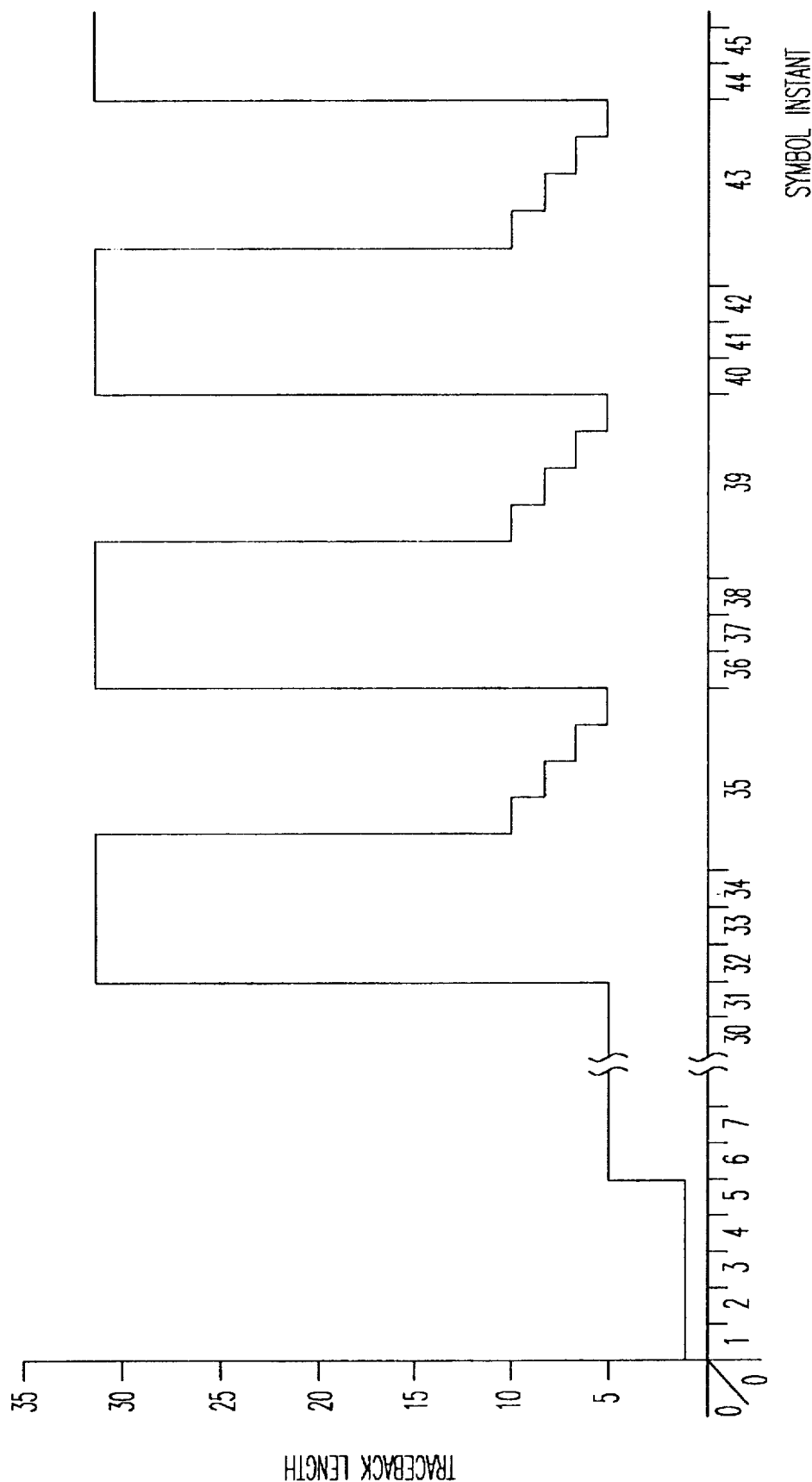
FIG. 10 is a graphical representation of the traceback lengths of FIG. 9.

An alternative sequence of the longer and shorter length tracebacks is shown in FIGS. 9 and 10. The series of tracebacks for symbol instants 1 through 29 may be the same as or different from those shown in FIGS. 5 and 6. In this sequence, a series of tracebacks are executed having the same length, followed by a series of tracebacks being executed having incrementally different traceback lengths. The series of tracebacks having incrementally different traceback lengths may be executed in a single symbol instant.

Tracebacks 930 and 931 having a second traceback length are executed in symbol instants 30 and 31 resulting in ephemeral decoded symbols in symbol instants 25 and 26. The traceback length is changed to the third traceback length. Tracebacks 932, 933, 934, and 935-1 are executed resulting in final decoded symbols in symbol instants 1, 2, 3 and 4, respectively. The traceback length is changed and a traceback executed resulting in an ephemeral decoded symbol. For example, the traceback length can be changed to 8 and traceback 935-2 executed to result in an ephemeral decoded symbol in symbol instant 27. The traceback length can be decremented to 7, traceback 935-3 executed resulting in an ephemeral decoded symbol in symbol instant 28. The traceback length can be decremented to 6, followed by execution of traceback 935-4. This results in an ephemeral decoded symbol in symbol instant 29. The traceback length can be decremented to 5, traceback 935-5 executed resulting in an ephemeral decoded symbol in symbol instant 30.

In symbol instant 36, the traceback length is changed to the third traceback length. With the traceback length maintained at the third traceback length, tracebacks 936, 937, 938 and 939-2 are executed in symbol instants 36, 37, 38 and 39, resulting in final decoded symbols in symbol instants 5, 6, 7 and 8.

The traceback length is changed to 8. The series of tracebacks 939-1, 939-3, 939-4 and 939-5 executed in the manner described above with respect to tracebacks 935-2, 935-3, 935-4 and 935-5. These tracebacks result in ephemeral decoded symbols in symbol instants 31, 32, 33 and 34.

While the example shown in FIGS. 9 and 10 has been described as having a sequence of tracebacks of the same length executed, followed by a sequence of tracebacks having decreasing traceback lengths executed, many other sequences are possible within the scope of the invention. In addition, rather than decreasing the traceback lengths in the series of tracebacks having incrementally different traceback lengths, the traceback lengths could be increased or have a less regular pattern.

The training bits are used to provide an initial estimate of the channel. This channel estimate is the estimated channel impulse response. The training bits transmitted are known.

The training bits, which may be modulated, are represented as complex numbers, represented as $$V=VI+jVQ$$

The received signals, including the received training bits, are complex numbers, having a real and imaginary parts, and represented as $$Z=ZI+jZQ.$$

These received signals represent originally transmitted signals that have been corrupted with intersymbol interference and noise. The tap weights also are complex and represented as $$H=HI+jHQ.$$

Since the received signals representing the training bits are known, and the training bits are known, the tap weights representing the channel impulse response can be calculated by cross correlation. The tap weights may be calculated using, for example sixteen, training bits which may be modulated, as follows:

$$H_{ZV}(k) = \sum_{m=1}^{16} \{ZI(k+m) + jZQ(k+m)\} \{VI(m) + jVQ(m)\}^*$$

where k is the tap instant, and * denotes complex conjugate.

More tap weights are calculated by this cross correlation than will be retained and used. As is known in the art, the tap weights are filtered by a moving average filter. A window of tap weights, of constraint length C in number, are selected in the window of highest power. These tap weights are used as the initial channel taps, which is the initial channel impulse response. The number of tap weights is determined by constraint C, set forth above, which ranges from 2 to 6. One of the tap weights represents the present symbol instant when a bit is received. The additional tap or taps represent the delayed signal, delayed by one symbol instant per tap.

Figure 11:
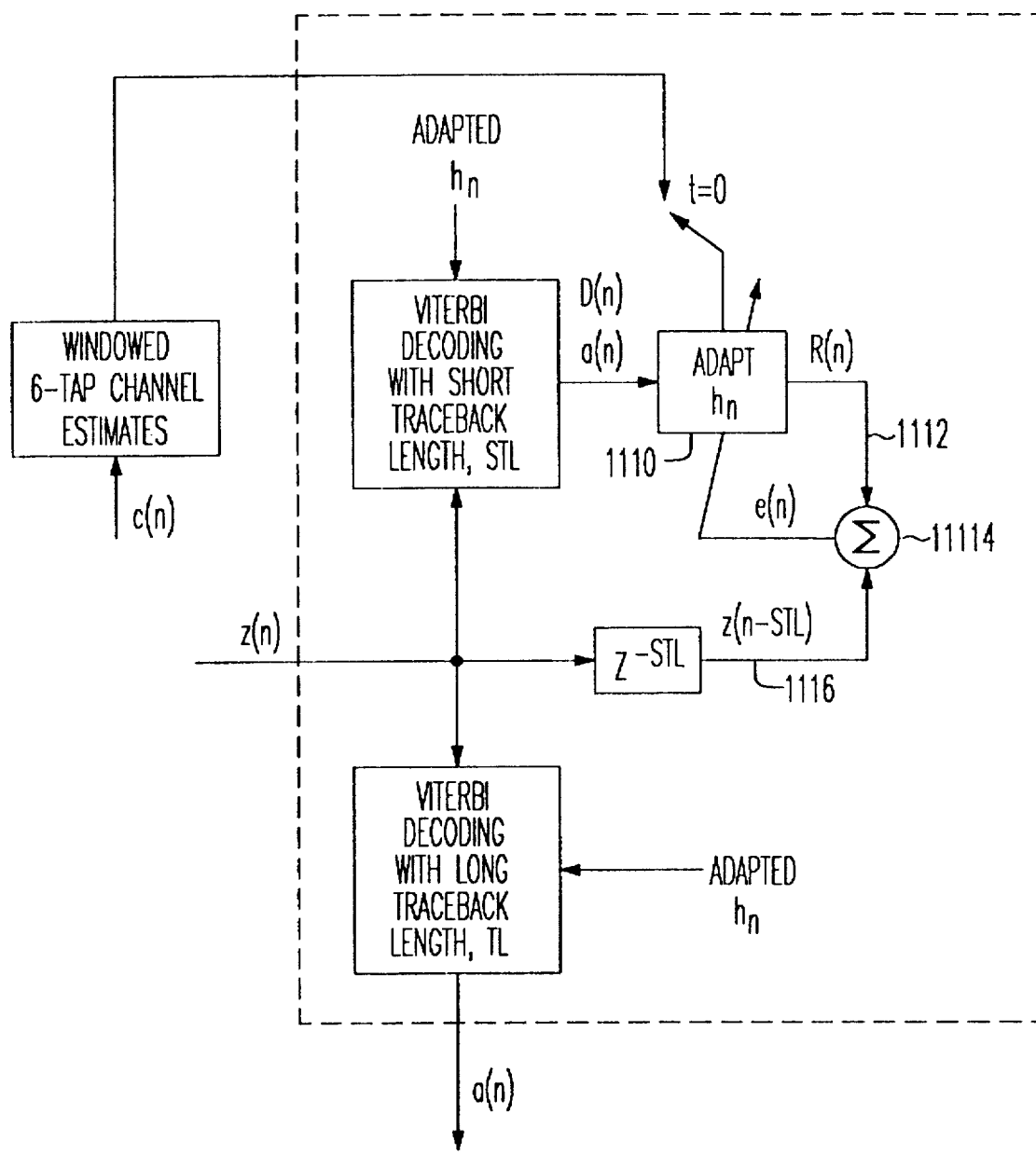
FIG. 11 is a block diagram of a portion of the receiver of FIG. 1.

A portion of the receiver is shown in FIG. 11. The initial channel taps H(n) are provided to equalizer 1110. The ephemeral decoded symbols are also provided to equalizer 1110.

The ephemeral decoded symbols are used in a known adaptation technique, disclosed in "Stationary and Nonstationary Learning Characteristics of the LMS Adaptive Filter" by B. Widrow, et al, Proceedings of the IEEE, vol. 64, No. 8, August, 1976, to adapt the channel impulse response at each symbol instant.

$$H(n+1)=H(n)+\mu e(n)D(n)$$

Where n is the symbol instant $\mu$ is a multiplication factor, called a forgetting factor, that contributes a portion of the error to the next channel adaptation. $\mu$ is greater than zero and is limited by the inverse of the maximum eigenvalue of the signal correlation matrix. Preferably $\mu$ is small. D is the series of ephemeral decoded symbols, initialized to a known bit pattern from transmission burst 100. D is a column vector of length C. Thus, for a constraint length of 3, there are three tap weights and four individual states.

At each symbol instant, subsequent to determining an ephemeral decoded symbol, the ephemeral decoded symbol is transferred to the equalizer. The ephemeral decoded symbol is shifted into the top of the D column vector. The ephemeral decoded symbol from a prior symbol instant, by C symbol instants, shifts out of the bottom of the D column vector.

The equalizer, at each symbol instant, takes the dot product of the ephemeral decoded symbols and the tap weights to produce the reconstructed signal R(n), as follows:

$$R(n)=D(n)^T H(n)$$

The reconstructed signal is provided as a first input 1112 to summing junction 1114. The received signal Z(n), delayed by the number of symbol instants of the second traceback length (STL) results in signal Z(n-STL). This delayed received signal is provided as a second input 1116 to the summing junction. Summing junction 1114 evaluates the difference between the two inputs and provides the difference as an error output e(n).

$$e(n)=Z(n-STL)-R(n)$$

The number of elements in each vector corresponds to the number of tap weights. Ideally the error is zero if the tap weights represent the channel impulse response and there has been no change in the channel. When an error is present, it is due to mismatch of the channel. The mismatch is weighted, by $\mu$ above, to adapt the channel impulse response to the existing channel characteristics. The updated impulse response is provided to and used in the Viterbi decoder. The updated impulse response is used in calculating branch metrics and next state accumulated costs at the next symbol instant.

While exemplary numerical values were used to illustrate the various embodiments of the present invention, the invention is not limited to numerical values illustrated. Tracebacks of various lengths and sequences are contemplated within the scope of the invention.

The invention is particularly useful in communication systems and equipment employing integrated circuits including this technique. Such communications systems and equipment has the advantage of initiating a traceback from any symbol instant with the traceback being of a programmable length.

While the illustrative embodiment of the invention has not been described as incorporating pipelining, one skilled in the an would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtractors.

We claim:

1. A method of operating a digital communication system for tracing a path through a trellis of surviving branch data from various symbol instants to determine a decoded symbol, the trellis stored in an array of storage registers, the method comprising the steps of:

initiating a first traceback from a storage register at a first symbol instant, the traceback tracing a path back through the trellis array of storage registers of surviving branch data a first predetermined number of symbol instants to determine a first decoded symbol; and initiating a second traceback from a storage register at the first symbol instant, the traceback tracing a path back through the trellis array of storage registers of surviving branch data a second predetermined number of symbol instants to determine a second decoded symbol.

2. A method of operating a digital communication system as recited in claim 1, wherein the second predetermined number of symbol instants is different from the first predetermined number of symbol instants.

3. A method of operating a digital communication system as recited in claim 2, wherein the second predetermined number is smaller than the first predetermined number.

4. A method of operating a digital communication system as recited in claim 1, further comprising the steps of:
   (a) updating the storage registers of the array with individual state information of an additional symbol instant;
   (b) initiating a traceback from a storage register at the additional symbol instant, the traceback tracing a path back through the storage registers of the array of states an initial number of symbol instants to determine a decoded symbol; and
   (c) repeating steps (a) and (b) until the storage registers of the array contains the surviving branch data of the first predetermined number of symbol instants.

5. A method of operating a digital communication system as recited in claim 1, wherein the storage register at the first symbol instant from which the first traceback is initiated is the same storage register at the first symbol instant from which the second traceback is initiated.

6. An integrated circuit, comprising:
   a digital signal processor;
   an error correction coprocessor coupled to the digital signal processor, the coprocessor implementing a Viterbi decoding function, the coprocessor having an update unit and a traceback unit; and
   random access memory couple to the coprocessor to receive surviving branch data from the update unit, the traceback having a traceback length register to store a traceback length, the traceback unit capable of initiating a traceback through registers of the random access memory upon the coprocessor receiving a traceback instruction from the digital signal processor, the number of symbol instants through which the traceback extends being determined by the traceback length stored in the traceback length register, whereby the traceback length is programmable and can be changed by over-writing the traceback length in the traceback length register.

7. A method of operating a digital communication system for tracing a path through a trellis of surviving branch data from various symbol instants to determine a decoded symbol, the trellis stored in an array of storage registers, the method comprising the steps of:
   initiating a first traceback from a storage register at a first symbol instant, the first traceback tracing a path back through the trellis array of storage registers of surviving branch data a first predetermined number of symbol instants to determine a first decoded symbol; and
   initiating a second traceback from a storage register at a second symbol instant, the second traceback tracing a path back through the trellis array of storage registers of surviving branch data a second predetermined number of symbol instants to determine a second decoded symbol, the second predetermined number of symbol instants being different from the first predetermined number of symbol instants.

8. A method of operating a digital communication system as recited in claim 7, wherein the second predetermined number is smaller than the first predetermined number.

9. A method of operating a digital communication system as recited in claim 7, further comprising the steps of:
   (a) updating the storage registers of the array with individual state information of an additional symbol instant;
   (b) initiating a traceback from a storage register at the additional symbol instant, the traceback tracing a path back through the storage registers of the array of states an initial number of symbol instants to determine a decoded symbol; and
   (c) repeating steps (a) and (b) until the storage registers of the array contains the surviving branch data of the first predetermined number of symbol instants.

* * * * *